United States Patent
Hardy et al.

(10) Patent No.: US 11,175,365 B2
(45) Date of Patent: *Nov. 16, 2021

(54) SYSTEM AND METHOD FOR SPARSE IMAGE RECONSTRUCTION UTILIZING NULL DATA CONSISTENCY

(71) Applicant: General Electric Company, Schenectady, NY (US)

(72) Inventors: Christopher Judson Hardy, Schenectady, NY (US); Itzik Malkiel, Herzliya (IL)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 712 days.

This patent is subject to a terminal disclaimer.

(21) Appl. No.: 16/150,079

(22) Filed: Oct. 2, 2018

(65) Prior Publication Data

US 2020/0103483 A1 Apr. 2, 2020

(51) Int. Cl.
*G01R 33/561* (2006.01)
*G01R 33/56* (2006.01)
*G06T 7/00* (2017.01)

(52) U.S. Cl.
CPC ...... *G01R 33/5611* (2013.01); *G01R 33/5608* (2013.01); *G06T 7/0012* (2013.01)

(58) Field of Classification Search
None
See application file for complete search history.

(56) References Cited

U.S. PATENT DOCUMENTS

| 8,374,413 B2 | 2/2013 | Chen |
| 8,717,024 B2 | 5/2014 | King et al. |

(Continued)

FOREIGN PATENT DOCUMENTS

| CN | 103679654 B | 2/2017 |
| CN | 104700440 B | 10/2017 |
| WO | 2017223560 A1 | 12/2017 |

OTHER PUBLICATIONS

U.S. Appl. No. 15/907,797, filed Feb. 28, 2018, Malkiel et al.

(Continued)

*Primary Examiner* — Douglas X Rodriguez
(74) *Attorney, Agent, or Firm* — Fletcher Yoder, P.C.

(57) ABSTRACT

A method is provided that includes acquiring coil data from a magnetic resonance imaging device. The coil data includes undersampled k-space data. The method includes processing the coil data using an image reconstruction technique to generate an initial undersampled image. The method includes generating a reconstructed image based on the coil data, the initial undersampled image, and multiple iterative blocks of a residual deep-learning image reconstruction network. A first iterative block of the residual deep-learning image reconstruction network receives the initial undersampled image. Each of the multiple iterative blocks includes a data-consistency unit that preserves the fidelity of the coil data in a respective output of a respective iterative block utilizing zeroed data consistency. The initial undersampled image is added to an output of the last iterative block via a residual connection. The residual deep-learning image reconstruction network is a neural network trained using previously acquired coil data.

20 Claims, 10 Drawing Sheets

(56) References Cited

U.S. PATENT DOCUMENTS

| | | | |
|---|---|---|---|
| 9,846,214 B2 | 12/2017 | Zhou et al. | |
| 10,895,622 B2* | 1/2021 | Polak | G06N 20/00 |
| 2017/0309018 A1 | 10/2017 | Knoll et al. | |
| 2019/0236817 A1* | 8/2019 | Cheng | G06N 3/0454 |
| 2020/0065969 A1* | 2/2020 | Huang | G06T 7/11 |

OTHER PUBLICATIONS

Pruessmann, Klaas P., et al.; "SENSE: Sensitivity Encoding for Fast MRI", Magnetic Resonance in Medicine, 42:952-962 (1999).

Griswold, Mark A., et al.; "Generalized Autocalibrating Partially Parallel Acquisitions (GRAPPA)", Magnetic Resonance in Medicine, 47:1202-1210 (2002).

Lustig, Michael, et al.; "Sparse MRI: The Application of Compressed Sensing for Rapid MR Imaging", Magnetic Resonance in Medicine, 58:1182-1195 (2007).

Ravishankar, Saiprasad; "MR Image Reconstruction from Highly Undersampled k-Space Data by Dictionary Learning", IEEE Transaction on Medical Imaging, vol. 30, No. 5, May 2011.

Han, Yo Seob, et al.; "Deep Residual Learning for Compressed Sensing CT Reconstruction via Persistent Homology Analysis", arXiv:1611.06391v2 [cs.CV] Nov. 25, 2016.

Lee, Dongwook, et al.; "Deep Artifact Learning for Compressed Sensing and Parallel MRI", arXiv:1703.01120v1 [cs.CV] Mar. 3, 2017.

Malkiel, Itzik, et al.; "Densely Connected Iterative Network for Sparse MRI Reconstruction", https://submission.mirasmart.com/ISMRM2018/ViewSubmission.aspx?sbmID=5936, pp. 1.

Hammernik, Kerstin, et al.; "Learning a Variational Network for Reconstruction of Accelerated MRI Data", Magnetic Resonance in Medicine, 79:3055-3071 (2018).

Schlemper, Jo, et al.; "A Deep Cascade of Convolutional Neural Networks for Dynamic MR Image Reconstruction", IEEE Transactions on Medical Imaging, vol. 37, No. 2, Feb. 2018.

* cited by examiner

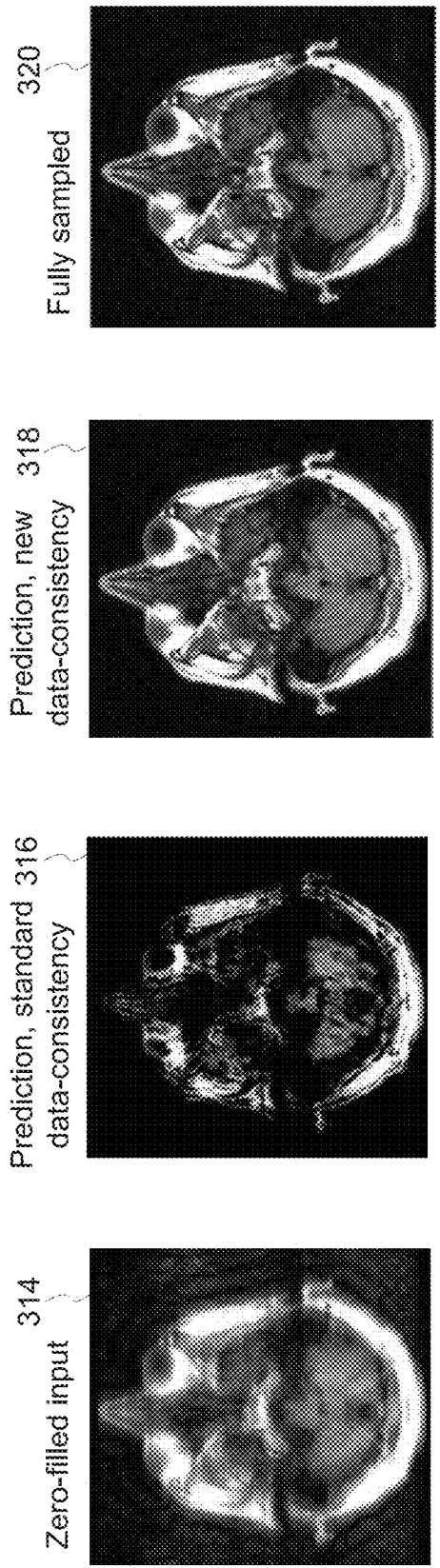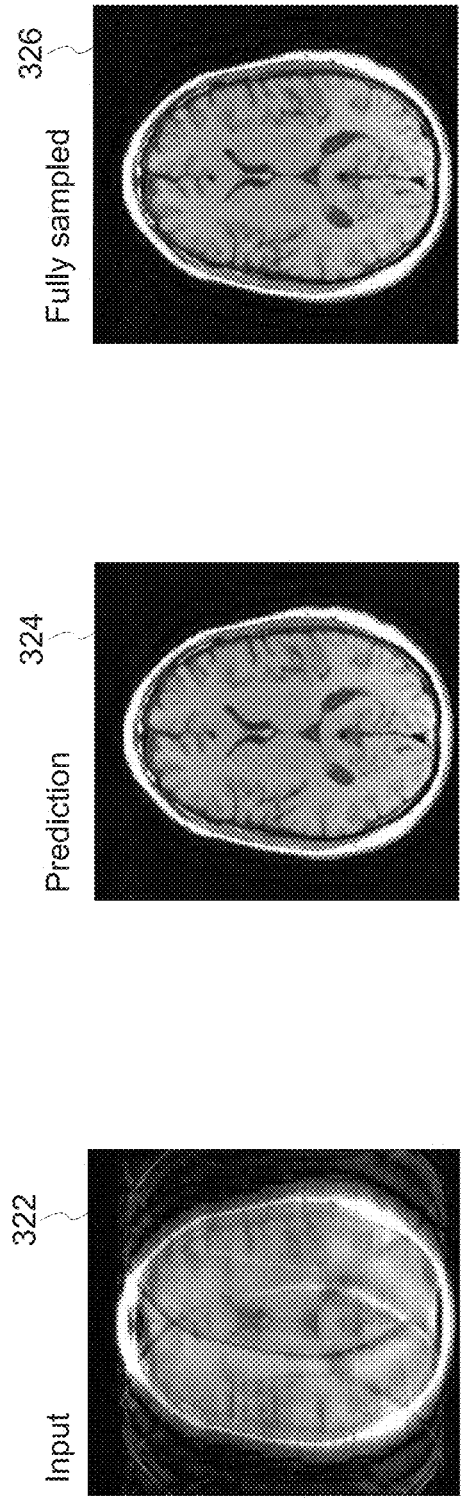

SYSTEM AND METHOD FOR SPARSE IMAGE RECONSTRUCTION UTILIZING NULL DATA CONSISTENCY

BACKGROUND

The subject matter disclosed herein relates to image reconstruction, and more particularly to systems and methods that utilize both residual learning and data consistency for reconstruction of undersampled magnetic resonance images.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

All reconstruction algorithms are subject to various trade-offs, such as between computational efficiency, patient dose, scanning speed, image quality, and artifacts. Therefore, there is a need for reconstruction techniques that may provide improved benefits, such as increased reconstruction efficiency or speed, while still achieving good image quality or allowing a low patient dose.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a method is provided. The method includes acquiring coil data from a magnetic resonance imaging device, wherein the coil data includes undersampled k-space data corresponding to a subject. The method also includes processing the coil data using an image reconstruction technique to generate an initial undersampled image. The method further includes generating a reconstructed image based on the coil data, the initial undersampled image, and multiple iterative blocks of a residual deep-learning image reconstruction network. A first iterative block of the residual deep-learning image reconstruction network receives the initial undersampled image. Each of the multiple iterative blocks includes a data-consistency unit that preserves the fidelity of the coil data in a respective output of a respective iterative block utilizing zeroed data consistency. The iterative blocks are connected by direct connections from one iterative block to the following iterative block. The initial undersampled image is added to an output of the last iterative block via a residual connection. The residual deep-learning image reconstruction network is a neural network trained using previously acquired coil data.

In another embodiment, a system is provided. The system includes a memory encoding processor-executable routine. The system also includes a processing component configured to access the memory and to execute the processor-executable routines. The routines when executed by the processing component, cause the processing component to acquire coil data from a magnetic resonance imaging device, wherein the coil data includes undersampled k-space data corresponding to a subject. The routines, when executed by the processing component, also cause the processing component to process the coil data using an image reconstruction technique to generate an initial undersampled image. The routines when executed by the processing component, further cause the processing component to generate a reconstructed image based on the coil data, the initial undersampled image, and multiple iterative blocks of a residual deep-learning image reconstruction network. A first iterative block of the residual deep-learning image reconstruction network receives the initial undersampled image. Each of the multiple iterative blocks includes a data-consistency unit that preserves the fidelity of the coil data in a respective output of a respective iterative block utilizing zeroed data consistency. The iterative blocks are connected by direct connections from one iterative block to the following iterative block. The initial undersampled image is added to an output of the last iterative block via a residual connection. The residual deep-learning image reconstruction network is a neural network trained using previously-acquired coil data.

In a further embodiment, a method is provided. The method includes acquiring coil data from a magnetic resonance imaging device, wherein the coil data include undersampled k-space data corresponding to a subject. The method also includes processing the coil data using an image reconstruction technique to generate an initial undersampled image. The method further includes generating a reconstructed image based on the coil data, the initial undersampled image, and a plurality of iterative blocks of a residual deep-learning image reconstruction network, wherein a first iterative block of the residual deep-learning image reconstruction network receives the initial undersampled image, and wherein each of the multiple iterative blocks includes a data-consistency unit that preserves fidelity of the coil data in a respective output of a respective iterative block utilizing zeroed data consistency, and wherein the iterative blocks are connected by direct connections from one iterative block to the following iterative block, and wherein the initial undersampled image is added to an output of the last iterative block via a residual connection, and wherein the residual deep-learning image reconstruction network is a neural network trained using previously acquired coil data.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIGS. 9A-9D illustrate the performance of the residual deep-learning image reconstruction network of FIG. 4 in accordance with aspects of the present disclosure;

FIGS. 10A-10C further illustrate the performance of the residual deep-learning image reconstruction network of FIG. 4 in accordance with aspects of the present disclosure.

DETAILED DESCRIPTION

Figure 1:
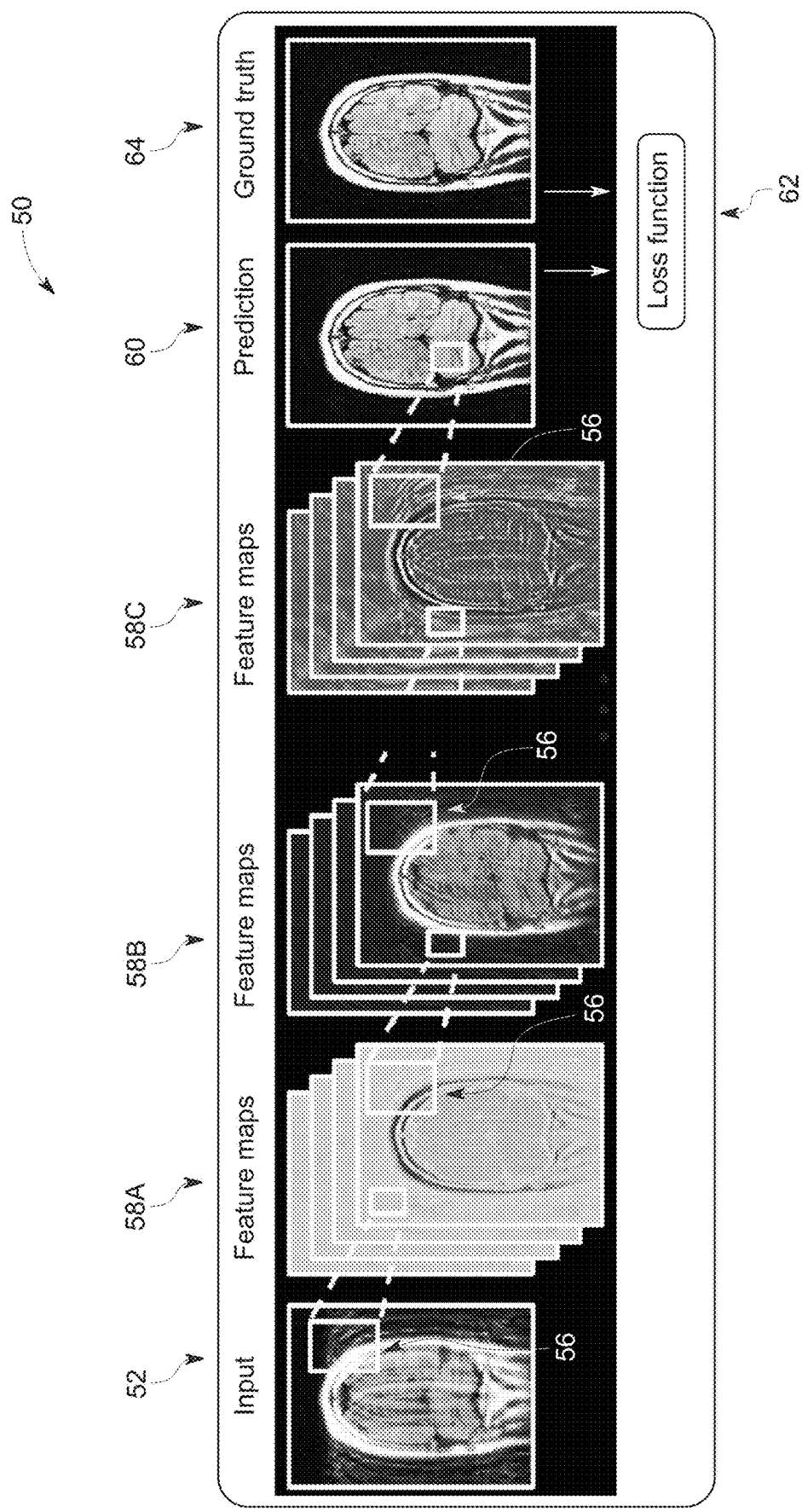
FIG. 1 depicts an example of an artificial neural network for training a deep-learning model, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing field where a set or type of acquired data undergoes a reconstruction process to generate an image or volume. In addition, though magnetic resonance imaging (MR or MRI) examples are primarily provided herein, it should be understood that the disclosed techniques may be used in other imaging modality contexts. For instance, the presently described approach may also be employed on data acquired by other types of scanners, including, but not limited to, computed tomography (CT) or positron emission tomography (PET)-MR scanners as well as others.

With this in mind, and as discussed herein, the present disclosure relates to systems and methods for image reconstruction, and more particularly reconstruction of magnetic resonance images. Embodiments disclosed herein are configured for using a residual deep-learning image reconstruction network to generate a fully sampled reconstructed image based on an undersampled k-space raw dataset acquired from a magnetic resonance imaging (MRI) device. The residual deep-learning image reconstruction network disclosed herein includes a plurality of iterative blocks. A residual connection is made between the input and the output of the network. In particular, an undersampled input image is provided to the first iterative block and also added to an output image from the last iterative block prior to comparison of the network output to the fully sampled ground-truth image in the loss function. This forces the network to learn the undersampling artifacts rather than the fully sampled image. In addition, each of the iterative blocks is configured to maintain data consistency between intermediate feature maps and the undersampled k-space raw dataset. Typically, residual learning and data consistency are not utilized in the same network. However, in certain embodiments of this invention, data-consistency lines are zeroed out, which results at each iterative step with those corresponding lines of k-space being pushed towards zero in the data-consistency block. Alternatively, the k-space subtraction step can be skipped during the data-consistency operation. Thus, the residual deep-learning image reconstruction network enables reconstruction of a fully sampled image from an undersampled input image generated from the undersampled k-space raw dataset utilizing null data consistency.

With the preceding introductory comments in mind, some generalized information is provided to provide both general context for aspects of the present disclosure and to facilitate understanding and explanation of certain of the technical concepts described herein.

Deep-learning approaches discussed herein may be based on artificial neural networks, and may therefore encompass deep neural networks, fully connected networks, convolutional neural networks (CNNs), perceptrons, auto encoders, recurrent networks, wavelet filter banks, or other neural network architectures. These techniques are referred to herein as deep-learning techniques, though this terminology may also be used specifically in reference to the use of deep neural networks, which is a neural network having a plurality of layers.

As discussed herein, deep-learning techniques (which may also be known as deep machine learning, hierarchical learning, or deep structured learning) are a branch of machine learning techniques that employ mathematical representations of data and artificial neural networks for learning and processing such representations. By way of example, deep-learning approaches may be characterized by their use of one or more algorithms to extract or model high level abstractions of a type of data-of-interest. This may be accomplished using one or more processing layers, with each layer typically corresponding to a different level of abstraction and, therefore potentially employing or utilizing different aspects of the initial data or outputs of a preceding layer (i.e., a hierarchy or cascade of layers) as the target of the processes or algorithms of a given layer. In an image processing or reconstruction context, this may be characterized as different layers corresponding to the different feature levels or resolution in the data.

In general, the processing from one representation space to the next-level representation space can be considered as one 'stage' of the process. Each stage of the process can be performed by separate neural networks or by different parts of one larger neural network. For example, as discussed herein, a single deep-learning network or multiple networks in coordination with one another may be used to reconstruct a fully sampled image from an undersampled input image generated from the undersampled k-space raw dataset. As discussed herein, the network utilizes both residual learning and data consistency.

As part of the initial training of deep-learning models to solve a particular problem, training data sets may be employed that have known initial values (e.g., input images, projection data, emission data, magnetic resonance data, and so forth) and known or desired values for a final output of the deep-learning model. The training of a single stage may have known input values corresponding to one representation space and known output values corresponding to a next-level representation space. In this manner, the deep-learning model may process (either in a supervised or guided manner or in an unsupervised or unguided manner) the known or training data sets until the mathematical relationships between the initial data and desired output(s) are discerned and/or the mathematical relationships between the inputs and outputs of each layer are discerned and characterized. Similarly, separate validation data sets may be employed in which both the initial and desired target values are known, but only the initial values are supplied to the trained deep-learning models, with the outputs then being compared to the outputs of the deep-learning model to validate the prior training and/or to prevent over-training.

The term "raw data" refers to data generated by an imaging device and the term "input dataset" refers to a plurality of two-dimensional spatial raw data corresponding to a plurality of MR coils. The term "k-space" refers to a vector space corresponding to the raw data acquired by an MR imaging device. The k-space may be considered as a 2D Fourier space and the MR images may be reconstructed using 2D inverse Fourier transformation. The k-space input dataset acquired from MR imaging device is also referred herein as "coil data". The term "undersampling" refers to subsampling or sampling the data at a fraction of the Nyquist sampling rate. Undersampling during data acquisition generates sparse data and the sparsity of the data is related to the undersampling factor. The term k-space refers to Fourier space in two dimensions (2D) or three-dimensions (3D) and the k-space data corresponds to the Fourier transform of the magnetic resonance (MR) image. The term "residual deep-learning image reconstruction network" used herein refers to a deep-learning image reconstruction network having a plurality of iterative blocks that is configured to effectively propagate features across layers with use of direct connections, while also providing a residual connection between the input and the output of the network. Specifically, in one embodiment, the deep-learning network may be a convolution layer-based network. The term "intermediate feature map" is used to refer to an output of an iterative block in the residual deep-learning image reconstruction network. The term "data consistency" refers to maintaining fidelity of coil data in the output of an iterative block. The term "regularization" refers to modifying an ill-posed optimization problem to have a feasible solution. The term "fully sampled image" is used to refer to an image reconstructed from k-space data sampled at the Nyquist sampling rate. The term "undersampled image" or "subsampled image" is used to refer to an image reconstructed from undersampled k-space data.

With the preceding in mind, FIG. 1 schematically depicts an example of an artificial neural network 50 that may be trained as a deep-learning model as discussed herein. In this example (e.g., a convolutional neural), the network 50 is multi-layered, with an input layer 52 and multiple layers including hidden layers 58A, 58B, and so forth, and an output layer 60 and the training target 64 present in the network 50. Each layer, in this example, uses a plurality of convolutional filters 56. The number of filters 56 may be constant between layers or may vary from layer to layer, and may have different sizes, e.g. 3×3 or 5×5. The convolutional filters 56 at each layer generate respective feature-map outputs that serve as inputs to the convolutional filters 56 of the next hierarchical layer. In practice, a bias term may be added to the feature maps, which are then sent through an activation function, such as rectified linear unit (ReLU), leaky ReLU, sigmoid function, hyperbolic tangent function, or otherwise specified or programmed. The outputs of the final layer constitute the network output 60 (e.g., predicted image) which, in conjunction with a target or ground-truth image 64, are used to compute some loss or error function 62, which will be backpropagated to guide the network training.

The loss or error function 62 measures the difference between the network output (i.e., a reconstructed image) and the training target (e.g., fully sampled ground-truth image). In certain implementations, the loss function may be the Mean-Squared Error (MSE) of the voxel-level values or partial-line-integral values and/or may account for differences involving other image features, such as image gradients or other image statistics. Alternatively, the loss function 62 could be defined by other metrics associated with the particular task in question, such as a Structural Similarity (SSIM) index as known in the art.

Figure 2:
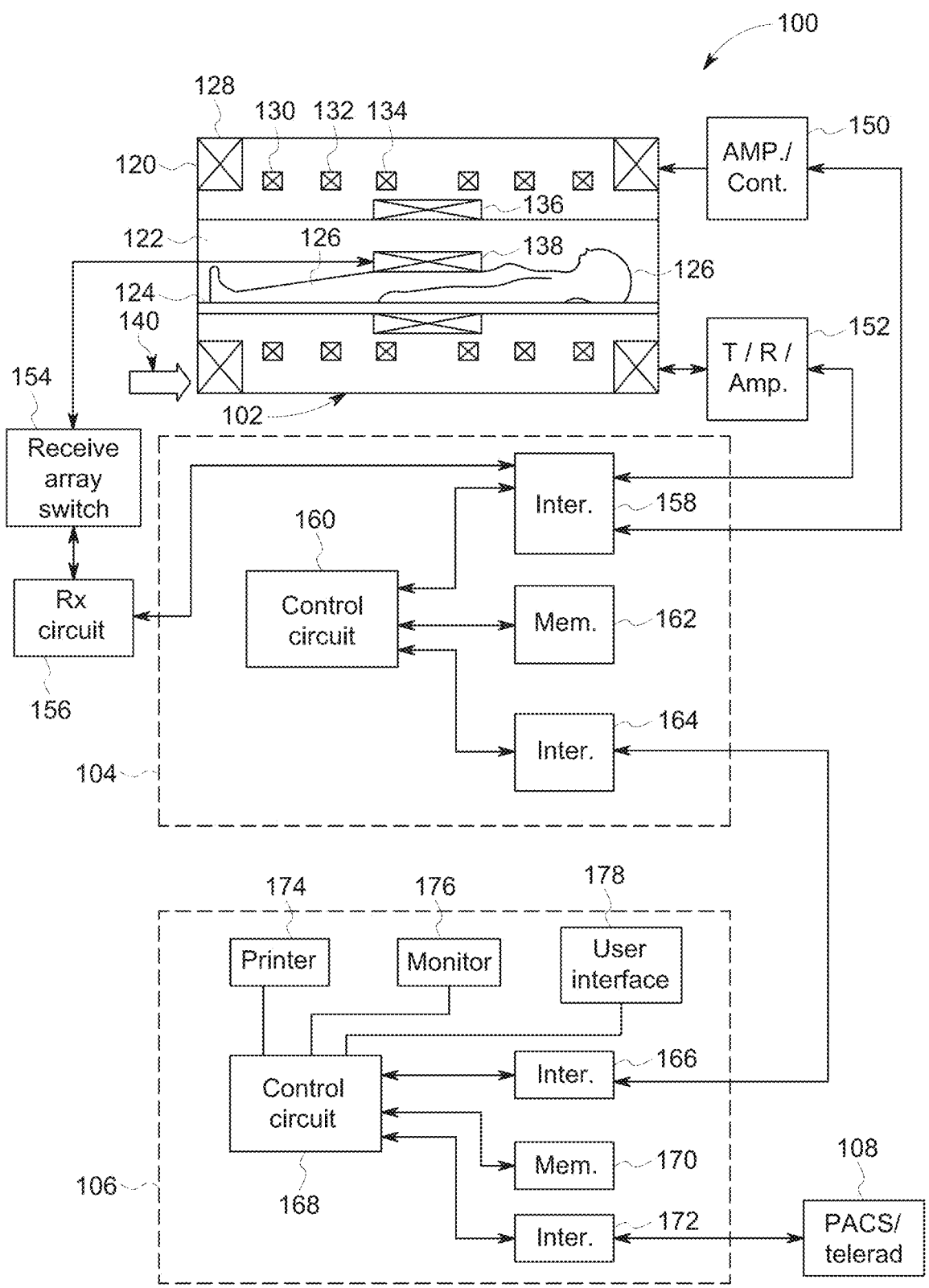
FIG. 2 illustrates an embodiment of a magnetic resonance imaging (MRI) system suitable for use with the disclosed technique.

With this in mind, the embodiments described herein may be implemented as at least a part of an MRI system, wherein specific imaging routines are initiated by a user (e.g., a radiologist or other technologist). The MRI system may perform data pre-acquisition, primary data acquisition, data reconstruction, and so forth. Accordingly, referring to FIG. 2, an MRI system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. In this embodiment, the data correspond to coil data generated by a plurality of radio frequency coils configured to transmit/receive RF signals to/from a region of interest in the subject. In this embodiment, the coil data includes undersampled k-space data. In one embodiment, an undersampling factor of four is used to generate the coil data. However, other undersampling factors may also be used during acquisition of the coil data. Undersampling of k-space data provides sparsity to the input data. The sparse input enables faster acquisition (or equivalently, reduced scanning duration) and therefore faster display of MR images to the technologist. While the MRI system 100 may include any suitable scanner or detector, in the illustrated embodiment, the system 100 includes a whole-body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 is configured to generate radio frequency pulses for exciting the certain gyromagnetic nuclei within the patient. In addition to the coils that may be local to the scanner 102, the system 100 also includes a set of receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_o$. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data. As noted above, in the case of MRI system 100, the coil data from receiving coils 138 includes undersampled k-space data.

The memory 170 stores a residual deep-learning image reconstruction network. The residual deep-learning image reconstruction network may be trained with previously acquired/stored coil data stored in the memory 170. The residual deep-learning image reconstruction network includes a plurality of iterative blocks coupled to one another connected by direct connections from one iterative block to the following iterative block. In addition, a residual connection couples the input of the network to the output of the network. Each iterative block includes a data-consistency unit and a regularization unit. In certain embodiments, the data-consistency unit and the regularization unit may function simultaneously in each iterative block. In certain embodiments, the network may alternate data-consistency and regularization steps. The data-consistency unit is configured to preserve the fidelity of the coil data in the output of the corresponding iterative block. The regularization unit is configured to generate regularization information. Further, the regularization unit is configured to reduce generalization error in the output of the corresponding iterative block based on the regularization information. The regularization unit includes a plurality of convolution layers, a plurality of bias layers and a plurality of leaky Rectified Linear Unit (ReLU) layers. The convolution layer is configured to generate feature maps using a plurality of spatial filters. The bias layer is configured to improve the modelling capability of the regularization unit and the leaky ReLU layer is a leaky version of a ReLU configured to improve propagation of gradients while providing an iterative solution to the optimization problem. The regularization unit is configured to minimize generalization error in the output of the corresponding iterative block. Specifically, the residual deep-learning image reconstruction network includes structural parameters such as, but not limited to, number of iterative blocks, numbers of filters and size of filters used for generation of feature maps and number of convolution layers used in regularization units. The residual deep-learning image reconstruction network also includes parameter values of data-consistency units and parameter values of regularization units. The parameter values of a regularization unit include parameter values of the filters used for generation of feature maps, bias values, and activation layer parameters. Further, the memory 170 also includes parameter values corresponding to data-consistency units and the transformation used by the data-consistency units. The memory 170 is also configured to store intermediate outputs of the regularization units such as feature maps, biased feature maps, and rectification layer outputs. The memory 170 also includes ground-truth images corresponding to undersampled k-space input datasets. The ground-truth images may be reconstructed from fully sampled k-space data, and the k-space data then retrospectively undersampled by discarding lines to generate the corresponding undersampled k-space data, for training.

Furthermore, any of well-known deep-learning training techniques may be employed by the image processing unit to train the residual deep-learning image reconstruction network based on the training dataset. During the training, one or more structural parameters of the residual deep-learning image reconstruction network may also be varied to determine optimal structure for the residual deep-learning image reconstruction network. Specifically, the control and analysis circuit 168 is configured to determine a plurality of parameters corresponding to the data-consistency unit and the regularization unit of the plurality of iterative blocks by training the residual deep-learning image reconstruction network to create output images that are similar to the corresponding ground-truth images. Further, the control and analysis circuit 168 is configured to store the residual deep-learning image reconstruction network in the memory 170.

An additional interface circuit 172 may be provided for exchanging image data, configuration parameters, and so forth with external system components such as remote access and storage devices 108. In certain embodiments, the remote access and storage devices 108, may store the residual deep-learning image reconstruction network, coil data, ground-truth images, and other data that the memory 170 stores. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 3:
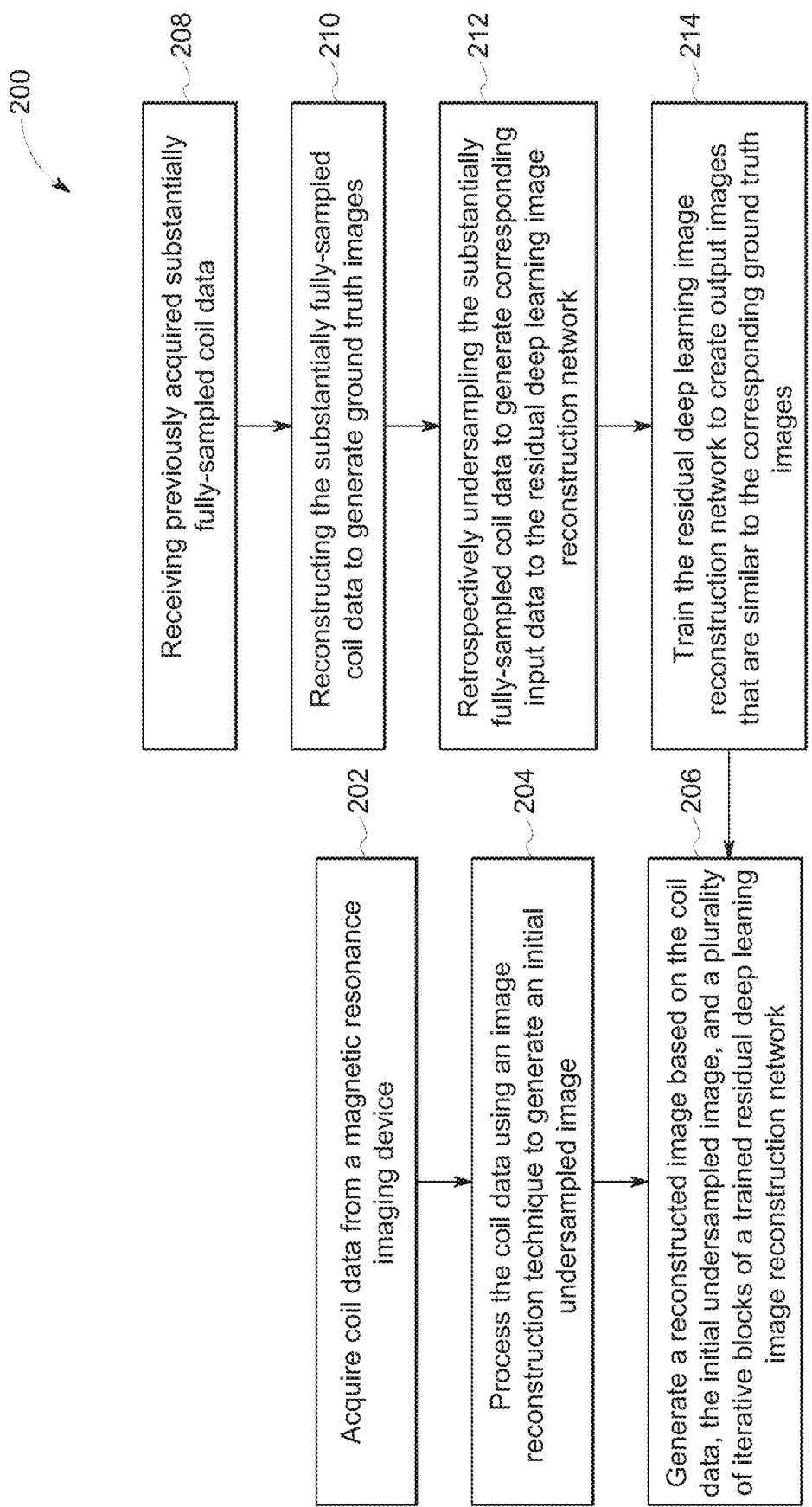
FIG. 3 is a flow chart illustrating an embodiment of a method for reconstructing images using a residual deep-learning image reconstruction network in accordance with aspects of the present disclosure.

FIG. 3 is a flow chart illustrating a method 200 for reconstructing images using a residual deep-learning image reconstruction network in accordance with aspects of the present disclosure. The method 200 includes acquiring coil data from an MRI device (block 202). The coil data comprises undersampled k-space raw data corresponding to a subject 126. The coil data may be generated by an array of eight receiver coils of an MRI device and an undersampling factor of 4 may be used while acquiring the coil data.

The method 200 also includes processing the coil data using an image reconstruction technique to generate an initial undersampled image (block 204). The image reconstruction technique may include any suitable technique with one example including 2D inverse Fourier transformation, accounting for coil sensitivities and using a method for combining the coil data to generate a complex reconstructed image (i.e., having real and imaginary components).

The method 200 further includes generating a reconstructed image based on the coil data, the initial undersampled image, and a plurality of iterative blocks of a residual deep-learning image reconstruction network (block 206). Each of the plurality of iterative blocks includes a data-consistency unit and a regularization unit. The residual deep-learning image reconstruction network is a neural network trained using previously acquired coil data. The number of iterative blocks used in the residual deep-learning image reconstruction network may vary. The iterative blocks are connected by direct connections from one iterative block to the following iterative block. Each of the data-consistency units is configured to preserve the fidelity of coil data in the output of the corresponding iterative block. The regularization unit is configured to direct the reconstruction of an MR image as a solution of the optimization problem solved by the residual deep-learning image reconstruction network.

Specifically, generating the reconstructed image includes preserving fidelity of the coil data in the output of each of the plurality of iterative blocks based on a corresponding data-consistency unit. Further, generating the reconstructed image also includes generating regularization information to reduce generalization error in the output of each of the plurality of iterative blocks based on a corresponding regularization unit. In one embodiment, the regularization information is generated by processing the direct input from the previous iterative block. The convolution network used for generating the regularization information includes a plurality of processing stages and each of the plurality of processing stage includes a convolution layer, a bias layer and a ReLU layer. In one embodiment, a leaky version of the ReLU layer is configured to improve propagation of gradients while providing an iterative solution to the optimization problem. Specifically, the convolution network includes a plurality of convolution layers, a plurality of bias layers and a plurality of leaky ReLU layers.

In one embodiment, the method 200 further includes receiving previously acquired substantially fully-sampled coil data from a database unit (block 208). Further, the method 200 includes reconstructing the substantially fully-sampled coil data to generate ground-truth images corresponding to the previously acquired coil data (block 210). The method 200 also includes retrospectively undersampling the substantially fully-sampled coil data to generate corresponding input data to the residual deep-learning image reconstruction network (block 212). Further, the method 200 includes determining a plurality of parameters corresponding to the data-consistency unit and the regularization unit of the plurality of iterative blocks by training the residual deep-learning image reconstruction network to create output images that are similar to the corresponding ground-truth images (block 214). The method 200 also includes storing the residual deep-learning image reconstruction network in the memory.

Figure 4:
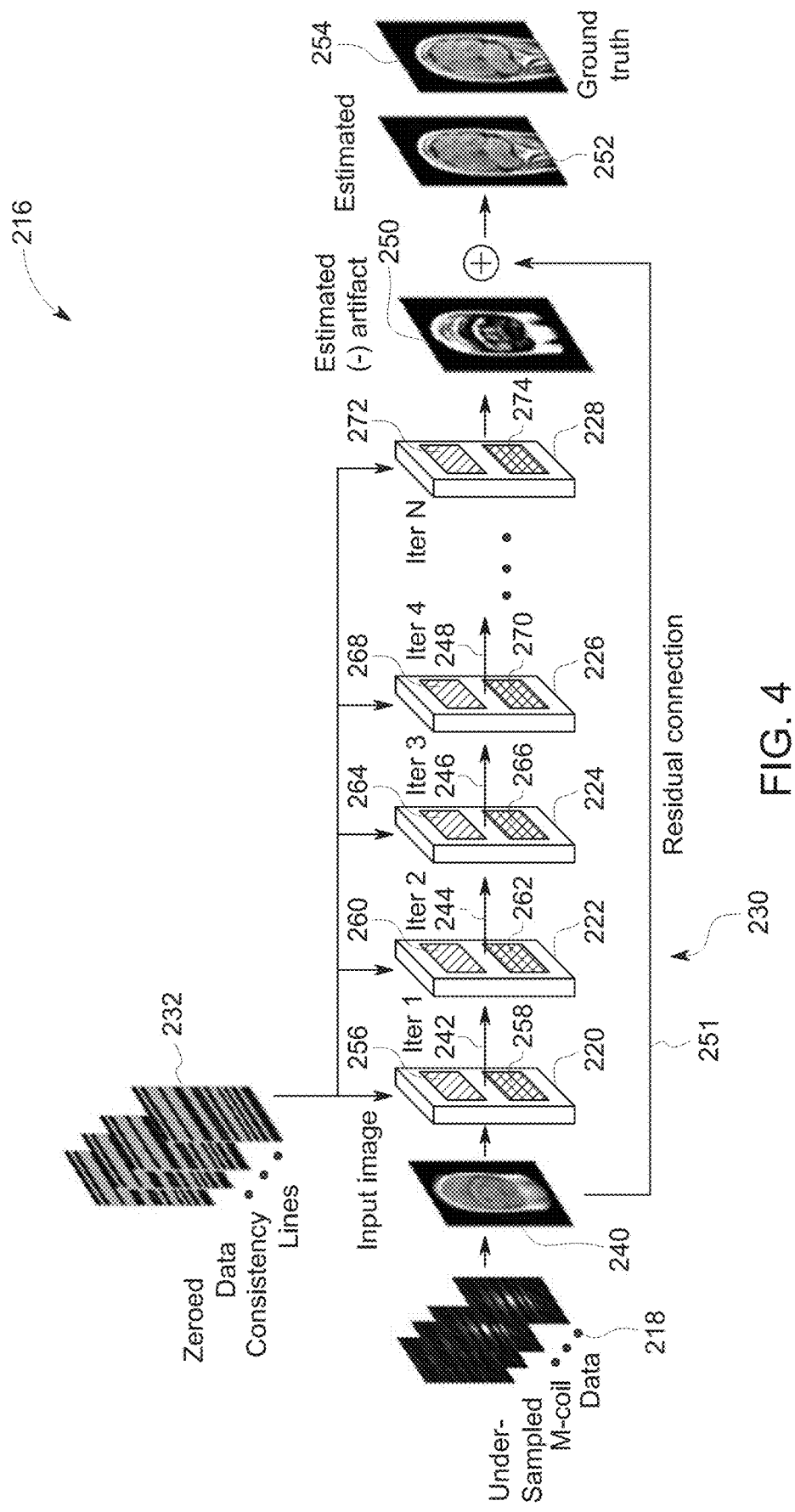
FIG. 4 is a block diagram illustrating an embodiment of a residual deep-learning image reconstruction network used for reconstructing images in accordance with aspects of the present disclosure.

FIG. 4 is a schematic 216 illustrating an embodiment of a residual deep-learning image reconstruction network (e.g., residual unrolled sparse network) used for reconstructing images in accordance with aspects of the present disclosure. The schematic 216 includes coil data 218 that is utilized to form the input. In the illustrated embodiment, the coil data 218 are two-dimensional k-space datasets from a plurality of coils (e.g., M coils). The schematic 216 further includes a plurality of iterative blocks 220, 222, 224, 226, and 228 forming a residual deep-learning image reconstruction network 230. The number of iterative blocks may vary. The iterative blocks of the residual deep-learning image reconstruction network 230 are connected by direct connections from one iterative block to the following iterative block. The residual deep-learning image reconstruction network 230 receives zeroed data-consistency lines 232 (i.e., data-consistency lines that are zeroed out). The zeroed data-consistency lines 232 are utilized during the data-consistency operation, at each iterative step, to push the corresponding lines of k-space (e.g., in the initial undersampled image 240 or iterative block output received from the adjacent iterative block) toward zero. The initial undersampled image 240 and the corresponding fully sampled ground-truth image share the acquired lines of k-space in common. As a result, a difference image between the initial undersampled image 240 and the corresponding fully sampled ground-truth image will have those common lines zeroed. The first iterative block 220 receives an initial undersampled image 240 based on the coil data 218. In particular, the coil data 218 are zero-filled, 2D fast Fourier transformed, and combined to form a complex input image (i.e., the initial undersampled imaged 240). The first iterative block 220 is configured to generate a first iterative block output based on the initial undersampled image 240 and the zeroed data-consistency lines 232. The first iterative block output is provided to the second iterative block 222 as a direct input by a direct connection 242. The second iterative block 222 is configured to generate a second iterative block output based on the first iterative block output 242 and the zeroed data-consistency lines 232. The third iterative block 224 is configured to receive the second iterative block output through a direct connection 244. The third iterative block 224 is also configured to generate a third iterative block output based on the second iterative block output 244 and the zeroed data-consistency lines 232. The fourth iterative block 226 is configured to receive the third iterative block output through a direct connection 246. The fourth iterative block 226 is also configured to generate a fourth iterative block output based on the third iterative block output 246 and the zeroed data-consistency lines 232 and provide it to the next iterative block via direct connection 248. The Nth iterative block 228 is configured to receive the iterative bock output through a direct connection from the iterative block immediately preceding it (not shown). The Nth iterative block 228 is also configured to generate a final iterative block output 250 based on the iterative block output from the immediately preceding iterative block and the zeroed data-consistency lines 232. The final iterative block output 250 is the estimated undersampling artifacts. It should be noted that images at all stages are typically complex.

The residual deep-learning image reconstruction network 230 includes a residual connection 251 that couples the input of the network 230 to the output of the network 230. In particular, the initial undersampled image 240 is added to the final iterative block output 250 to generate estimated image 252. The estimated image 252 is compared to the corresponding fully sampled ground-truth image 254 to determine the loss function (e.g., mean square error). The network 230 may be trained by retrospectively undersampling thousands of fully sampled images.

As stated previously, each of the plurality of iterative blocks 220, 222, 224, 226, 228 includes a data-consistency unit and a regularization unit. Specifically, the iterative block 220 includes a data-consistency unit 256 and regularization unit 258. The iterative block 222 includes a data-consistency unit 260 and a regularization unit 262. The iterative block 224 includes a data-consistency unit 264 and a regularization unit 266. Similarly, the iterative block 226 includes a data-consistency unit 268 and a regularization unit 270 and the iterative block 228 includes a data-consistency unit 272 and a regularization unit 274. The data-consistency units 256, 260, 264, 268, 272 are configured to preserve fidelity of coil data in the respective iterative block outputs. The regularization units 258, 262, 266, 270, 274 are configured to generate regularization information based on the respective outputs from the respective proceeding iterative blocks. The regularization information is representative of additional information required to reduce generalization error in output of each of the iterative blocks.

Figure 5:
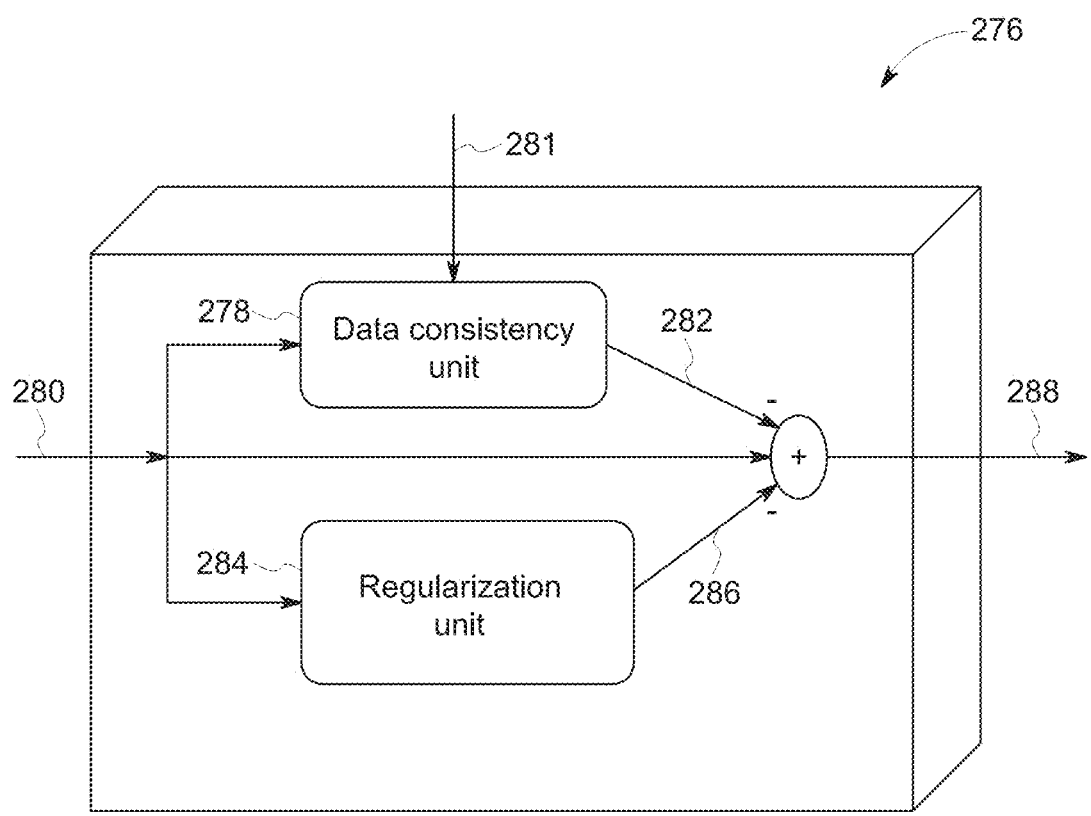
FIG. 5 is a block diagram of an embodiment of an iterative block used in the residual deep-learning image reconstruction network of FIG. 4 in accordance with aspects of the present disclosure.

FIG. 5 is a block diagram of an iterative block 276 used in the residual deep-learning image reconstruction network of FIG. 4 in accordance with aspects of the present disclosure. The iterative block 276 provides an iterative solution to image reconstruction formulated as an optimization problem. The iterative block 276 includes a data-consistency unit 278 configured to receive a first input 280 which is an iterative block output from a previous iterative block. Further, the data-consistency unit 278 is configured to receive zeroed data-consistency lines 281 (equivalent of 232 in FIG. 4). Further, the data-consistency unit 278 is configured to generate a first output 282 representative of a correction required to maintain data consistency in the first input 280. The function of the data-consistency unit 278 will be described in greater detail below.

Figure 6:
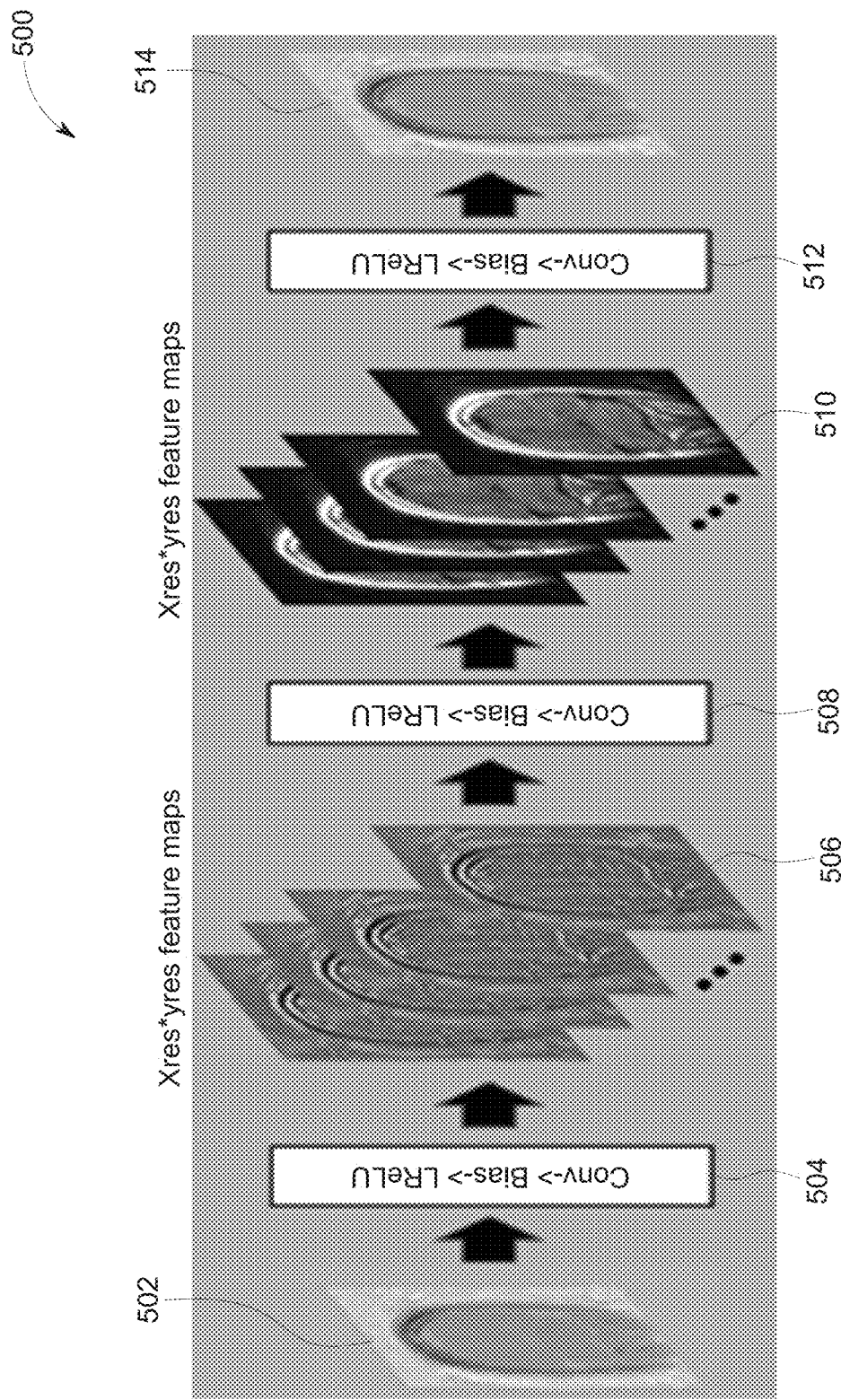
FIG. 6 is a block diagram of a regularization unit used in the residual deep-learning network of FIG. 4 in accordance with aspects of the present disclosure.

The iterative block 276 also includes a regularization unit 284 configured to receive the first input 280. Regularization is a multi-stage convolutional network with multiple filters in the initial stages and a single filter at the output stage. In one embodiment, the regularization unit 284 is a deep-learning network 500 (e.g., convolution neural network) as illustrated in FIG. 6. The deep learning network 500 is configured to receive an input image 502 from the previous iterative block and generate a reconstructed image 514. The deep learning network 500 includes a plurality of stages 504, 508, 512. Each of the plurality of stages 504, 508, 512 includes a feature generator, a bias provider, and an activation layer. In one embodiment, the feature generator is a convolutional layer having a plurality of filters. The feature generator is configured to generate a plurality of feature maps based on the input image. The bias provider is configured to receive the plurality of feature maps and generate a plurality of biased feature maps. The activation layer is configured to receive the plurality of biased output feature maps and generate one or more output images. The plurality of stages includes a first stage 504, a second stage 508 and a third stage 512. The first stage 504 is configured to process the plurality of input images 502 to generate a first plurality of output images 506. The plurality of input images 502 is an output of one of an immediately preceding iterative block or a skip block of an iterative block having the deep learning network 500. The second stage 508 is configured to process the first plurality of output images 506 and generate a second plurality of output images 510. The third stage 512 is configured to process the second plurality of output images 510 to generate the reconstructed image 514. The number of stages may vary.

Turning back to FIG. 5, the regularization unit 284 is configured to generate regularization information 286. The regularization information 286 is representative of additional information required to determine a valid solution to an ill-posed optimization problem. The regularization unit 284 is able to propagate features across multiple layers to generate regularization information 286. The iterative block 276 generates an output 288 based on the input 280, the zeroed data-consistency 281, and the regularization information 286. In certain embodiments, the data-consistency unit 278 and the regularization unit 284 may function simultaneously in each iterative block. In certain embodiments, the network may alternate data-consistency and regularization steps.

Figure 7:
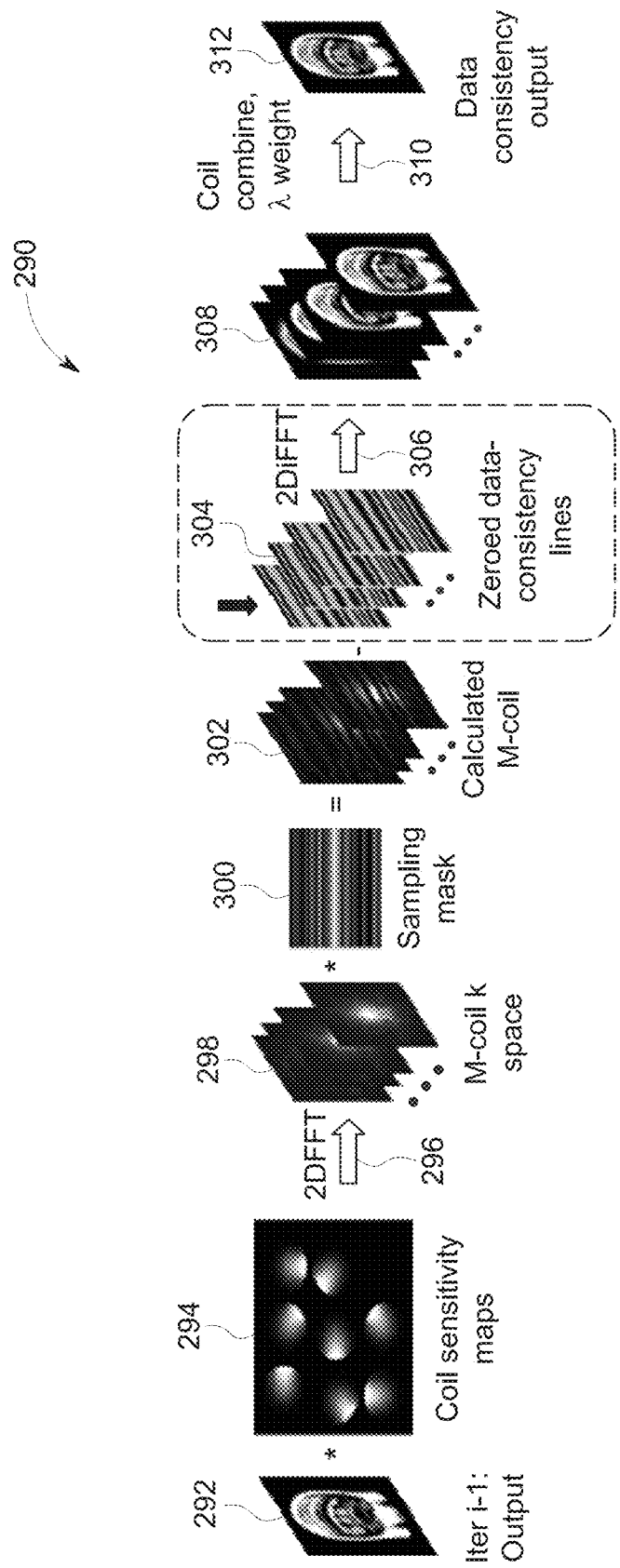
FIG. 7 is a block diagram of an embodiment of a data-consistency unit used in the residual deep-learning image reconstruction network of FIG. 4 (e.g., utilizing zeroed data-consistency lines) in accordance with aspects of the present disclosure.

FIG. 7 is a block diagram of an embodiment of a data-consistency unit 290 (e.g., similar to data-consistency unit 278 in FIG. 5) used in the residual deep-learning image reconstruction network of FIG. 4 (e.g., utilizing zeroed data-consistency lines) in accordance with aspects of the present disclosure. In the data-consistency unit 290, the image output 292 from the preceding iterative block is multiplied by coil sensitivity maps 294 and then 2D fast Fourier transformed (as represented by reference numeral 296) to generate k-space representations 298 of the image from each coil. The k-space representations 298 for each coil are multiplied by a sampling mask 300 to generate calculated M-coil k-space data 302 for each coil. During typical data-consistency operations, acquired k-space data (e.g., the undersampled coil data utilized to generate the undersampled input image to the network) is subtracted from the calculated M-coil k-space data 302. However, this would be incompatible with the residual learning of the network since artifact images are not consistent with acquired k-space data lines. Instead, in the current embodiment, zeroed data-consistency lines are subtracted from the corresponding calculated M-coil k-space data lines 302 and then inverse 2D fast Fourier transformation is performed (as represented by reference numeral 306) to generate complex images 308 for each coil. The data-consistency unit 290 then combines the complex images 308 from each coil and a weighting factor is applied (as represented by reference numeral 310) to generate an output 312 of the data-consistency block.

Figure 8:
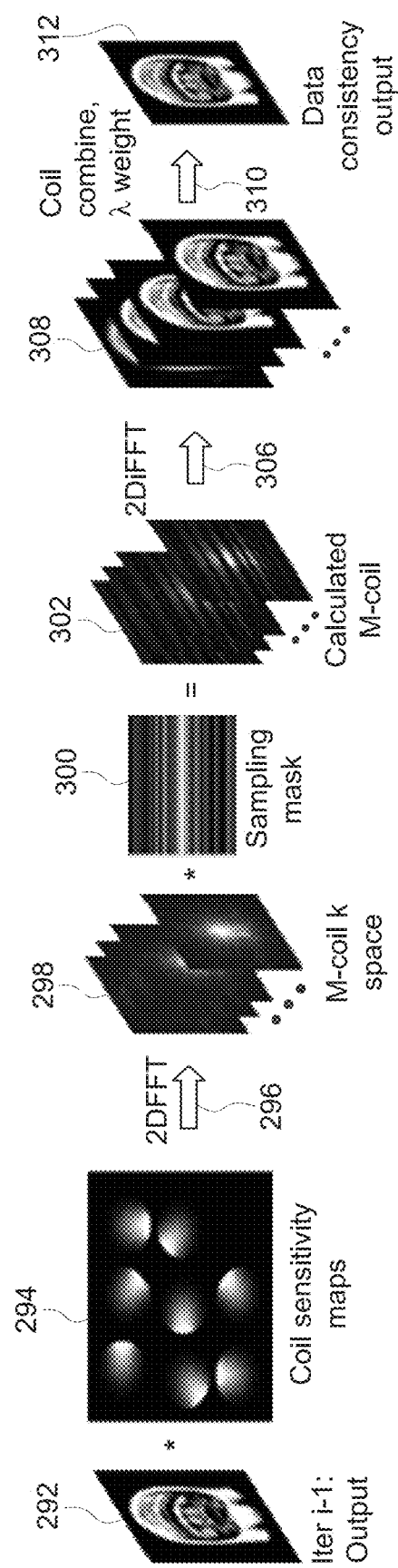
FIG. 8 is a block diagram of an embodiment of a data-consistency unit used in the residual deep-learning image reconstruction network of FIG. 4 (e.g., skipping subtraction of acquired coil data from calculated coil data) in accordance with aspects of the present disclosure.

FIG. 8 illustrates an alternative data-consistency operation that is also compatible with the residual learning of the network. As depicted in FIG. 8, the calculated M-coil k-space data 302 is directly inverse Fast Fourier transformed (as indicated by reference numeral 306). In other words, the subtraction of zeroed data-consistency lines (as illustrated in FIG. 7) or acquired M-coil k-space data (e.g., as performed in typical data-consistency operations in networks that do not utilize residual learning) is omitted.

FIGS. 9A-9D illustrate the performance of the residual deep-learning image reconstruction network of FIG. 4 in accordance with aspects of the present disclosure. FIG. 9A is the zero-filled input image 314 (e.g., initial undersampled image). Image 314 is undersampled by fourfold. FIG. 9B is the predicted or estimated image 316 utilizing standard data consistency. FIG. 9C is the predicted or estimated image 318 utilizing the residual deep-learning image reconstruction network of FIG. 4 and the data-consistency operation illustrated in either FIG. 7 or FIG. 8. Both images 316 and 318 were generated after approximately 60 epochs of training. FIG. 9D is the fully sampled ground-truth image 320 sampled at the Nyquist sampling rate. As depicted, the image quality of image 318 is superior to image 316. In addition, image 318 is very similar to image 320.

FIGS. 10A-10C further illustrate the performance of the residual deep-learning image reconstruction network of FIG. 4 in accordance with aspects of the present disclosure. FIG. 10A is the zero-filled input image 322 (e.g., initial under-sampled image). Image 322 is undersampled by fourfold. FIG. 10B is the predicted or estimated image 324 utilizing the residual deep-learning image reconstruction network of FIG. 4 and the data-consistency operation illustrated in either FIG. 7 or FIG. 8. Image 324 was generated after approximately 1000 epochs of training. FIG. 10C is the fully sampled ground-truth image 326 sampled at the Nyquist sampling rate. As depicted, image 324 is very similar to image 326.

Figure 11:
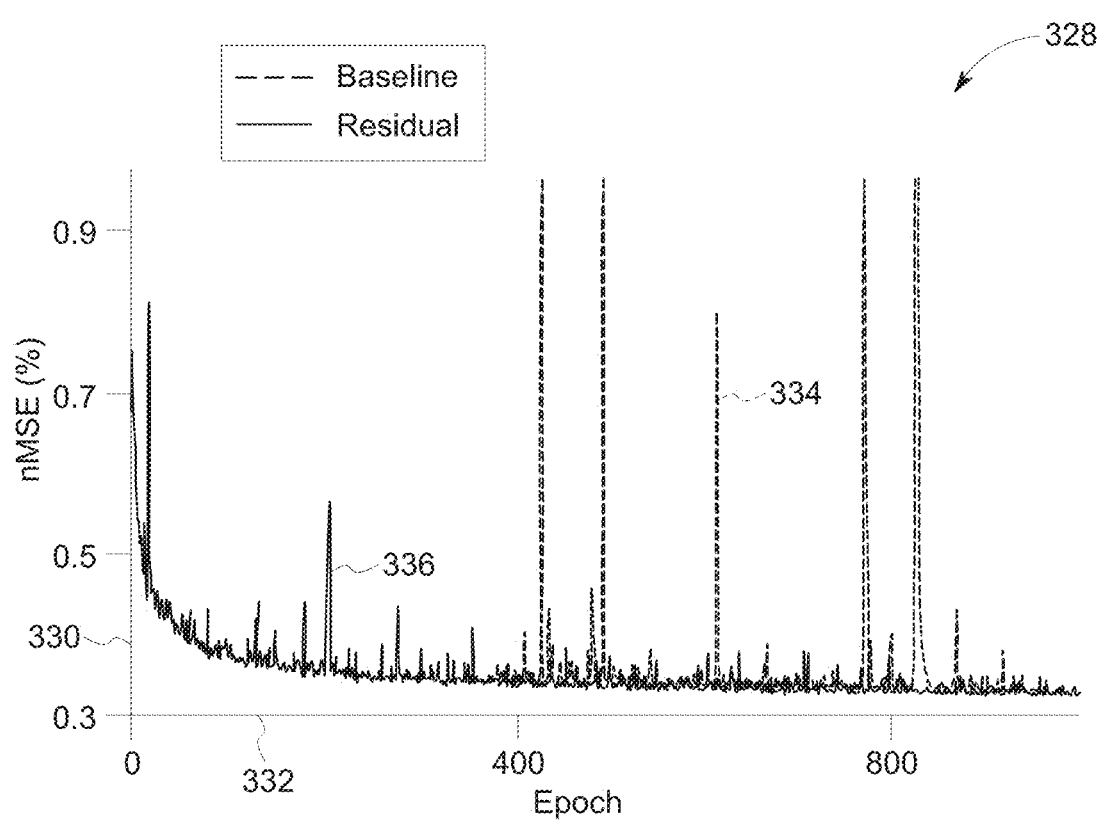
FIG. 11 illustrates a graphical representation of mean-square-error loss function during training of the residual deep-learning image reconstruction network of FIG. 4 versus a standard network.

FIG. 11 illustrates a graphical representation 238 of mean-square-error (MSE) loss function during training of the residual deep-learning image reconstruction network of FIG. 4 versus a standard network. The y-axis 330 represents the normalized MSE value (as a percentage) and the x-axis 332 represents the number of epochs of training. Plot 334 (shown as a dashed plot) represents MSE loss function for a standard network (i.e., non-residual network) that utilizes standard data consistency. Plot 336 (shown as a solid plot) represents the MSE loss function for the residual deep-learning image reconstruction network of FIG. 4 utilizing the data-consistency operation illustrated in either FIG. 7 or FIG. 8. As depicted, plot 336 converges more stably with fewer spikes as the epochs increase.

In other embodiments, the residual deep-learning image reconstruction network discussed above may be modified. In certain embodiments, the residual connection may result in subtraction instead of addition at the end of the network. In certain embodiments, residual skip-connections may be provided to one or more intermediate stages of the network rather than only the end. In certain embodiments, instead of the "soft" data-consistency enforcement described above, "hard" data consistency may be utilized by overwriting acquired lines of k-space with zeroes rather than subtracting. In certain embodiments, the network described above may also include dense skip-connections. The term "skip connection" refers to feeding of an output of an antecedent first iterative block to be concatenated to the input to a subsequent second iterative block with one or more iterative blocks in between the first iterative block and the second iterative block.

Technical effects of the disclosed embodiments include providing a sparse MRI reconstruction network that utilizes both residual learning and data consistency. Thus, the sparse MRI reconstruction network may be more easily trained (than a conventional network) due to the residual learning resulting in better image quality and faster training. In addition, the data-consistency operation of the sparse MRI reconstruction network minimizes "hallucination" (i.e., the introduction or suppression of features in the reconstructed image).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
   acquiring coil data from a magnetic resonance imaging device, wherein the coil data comprises undersampled k-space data corresponding to a subject;

processing the coil data using an image reconstruction technique to generate an initial undersampled image; and generating a reconstructed image based on the coil data, the initial undersampled image, and a plurality of iterative blocks of a residual deep-learning image reconstruction network, wherein a first iterative block of the residual deep-learning image reconstruction network receives the initial undersampled image, and wherein each of the plurality of iterative blocks comprises a data-consistency unit that preserves the fidelity of the coil data in a respective output of a respective iterative block utilizing zeroed data consistency, wherein the iterative blocks are connected by direct connections from one iterative block to the following iterative block, and wherein the initial undersampled image is added to an output of the last iterative block via a residual connection, and wherein the residual deep-learning image reconstruction network is a neural network trained using previously acquired coil data.

2. The method of claim 1, wherein the initial undersampled image is added to the output of the last iterative block of the residual deep-learning image reconstruction network prior to comparing the output to a ground-truth image to determine a loss function or error function.

3. The method of claim 1, wherein preserving the fidelity of the coil data comprises providing zeroed data-consistency lines as input to each of the plurality of iterative blocks, wherein the zeroed data-consistency lines are subtracted from calculated coil data generated by the corresponding data-consistency unit.

4. The method of claim 1, wherein preserving the fidelity of the coil data comprises utilizing calculated coil data generated by the preceding iterative block without subtracting the acquired coil data from the calculated coil data.

5. The method of claim 1, wherein each of the plurality of iterative blocks comprises a regularization unit.

6. The method of claim 5, wherein generating the reconstructed image comprises generating regularization information to reduce generalization error in output of each of the plurality of iterative blocks based on a corresponding regularization unit.

7. The method of claim 5, comprising:
receiving previously acquired substantially fully-sampled coil data from a database unit;
reconstructing the substantially fully-sampled coil data to generate ground-truth images corresponding to the previously acquired coil data;
retrospectively undersampling the substantially fully-sampled coil data to generate corresponding input data to the residual deep-learning image reconstruction network;
determining a plurality of parameters corresponding to the data-consistency unit and the regularization unit of the plurality of iterative blocks by training the residual deep-learning image reconstruction network to create output images that are similar to the corresponding ground-truth images; and
storing the trained residual deep-learning image reconstruction network in the database unit.

8. The method of claim 1, wherein the initial undersampled image is a complex composite image.

9. An imaging system comprising:
a memory encoding processor-executable routines;
a processing component configured to access the memory and to execute the processor-executable routines, wherein the routines, when executed by the processing component, cause the processing component to:
acquire coil data from a magnetic resonance imaging device, wherein the coil data comprises undersampled k-space data corresponding to a subject;
process the coil data using an image reconstruction technique to generate an initial undersampled image; and
generate a reconstructed image based on the coil data, the initial undersampled image, and a plurality of iterative blocks of a residual deep-learning image reconstruction network, wherein a first iterative block of the residual deep-learning image reconstruction network receives the initial undersampled image, and wherein each of the plurality of iterative blocks comprises a data-consistency unit that preserves the fidelity of the coil data in a respective output of a respective iterative block utilizing zeroed data consistency, wherein the iterative blocks are connected by direct connections from one iterative block to the following iterative block, and wherein the initial undersampled image is added to an output of the last iterative block via a residual connection, and wherein the residual deep-learning image reconstruction network is a neural network trained using previously acquired coil data.

10. The imaging system of claim 9, wherein the initial undersampled image is a complex composite image.

11. The imaging system of claim 9, wherein the processing component is configured to add the initial undersampled image to the output of the last iterative block of the residual deep-learning image reconstruction network prior to comparing the output to a ground-truth image to determine a loss function or error function.

12. The imaging system of claim 9, wherein the processing component is configured to generate the reconstructed image by preserving fidelity of the coil data in output of each of the plurality of iterative blocks based on a corresponding data-consistency unit.

13. The imaging system of claim 12, wherein preserving the fidelity of the coil data comprises utilizing zeroed data consistency.

14. The imaging system of claim 13, wherein the processing component is configured to preserve the fidelity of the coil data by providing zeroed data-consistency lines as input to each of the plurality of iterative blocks and subtracting the zeroed data-consistency lines from calculated coil data generated by the corresponding data-consistency unit.

15. The imaging system of claim 12, wherein the processing component is configured to preserve the fidelity of the coil data by utilizing calculated coil data generated by the corresponding data-consistency unit without subtracting the acquired coil data from the calculated coil data.

16. The imaging system of claim 9, wherein each of the plurality of iterative blocks comprises a regularization unit.

17. The imaging system of claim 16, wherein the processing component is configured to generate the reconstructed image by generating regularization information to reduce generalization error in output of each of the plurality of iterative blocks based on a corresponding regularization unit.

18. The imaging system of claim 16, wherein the routines, when executed by the processing component, cause the processing component to:
receive previously acquired substantially fully-sampled coil data from a database unit;

reconstruct the substantially fully-sampled coil data to generate ground-truth images corresponding to the previously acquired coil data;
retrospectively undersample the substantially fully-sampled coil data to generate corresponding input data to the residual deep-learning image reconstruction network;
determine a plurality of parameters corresponding to the data-consistency unit and the regularization unit of the plurality of iterative blocks by training the residual deep-learning image reconstruction network to create output images that are similar to the corresponding ground-truth images; and
store the trained residual deep-learning image reconstruction network in the database unit.

19. A method, comprising:
acquiring coil data from a magnetic resonance imaging device, wherein the coil data comprises undersampled k-space data corresponding to a subject;
processing the coil data using an image reconstruction technique to generate an initial undersampled image; and
generating a reconstructed image based on the coil data, the initial undersampled image, and a plurality of iterative blocks of a residual deep-learning image reconstruction network, wherein a first iterative block of the residual deep-learning image reconstruction network receives the initial undersampled image, and wherein each of the plurality of iterative blocks comprises a data-consistency unit that preserves fidelity of the coil data in a respective output of a respective iterative block utilizing zeroed data consistency, and wherein the iterative blocks are connected by direct connections from one iterative block to the following iterative block, and wherein the initial undersampled image is added to an output of the last iterative block via a residual connection, and wherein the residual deep-learning image reconstruction network is a neural network trained using previously acquired coil data.

20. The method of claim 19, wherein the initial undersampled image is added to the output of the last iterative block of the residual deep-learning image reconstruction network prior to comparing the output to a ground-truth image to determine a loss function or error function.

* * * * *